United States Patent [19]
Patel et al.

[11] Patent Number: 5,633,832
[45] Date of Patent: May 27, 1997

[54] REDUCED AREA WORD LINE DRIVING CIRCUIT FOR RANDOM ACCESS MEMORY

[75] Inventors: Vipul C. Patel; Kenneth A. Poteet, both of San Jose; Chitranjan N. Reddy, Los Altos Hills, all of Calif.

[73] Assignee: Alliance Semiconductor Corporation, San Jose, Calif.

[21] Appl. No.: 533,755

[22] Filed: Sep. 26, 1995

[51] Int. Cl.$^6$ .................................................. G11C 7/00
[52] U.S. Cl. ........................... 365/230.06; 365/189.11
[58] Field of Search ...................... 365/189.11, 230.06, 365/230.03

[56] References Cited

U.S. PATENT DOCUMENTS

| | | | |
|---|---|---|---|
| 4,649,521 | 3/1987 | Tsuchida et al. | 365/230.06 |
| 4,951,259 | 8/1990 | Sato et al. | 365/230.06 |
| 5,282,171 | 1/1994 | Tokami et al. | 365/230.01 |
| 5,363,338 | 11/1994 | Oh | 365/230.06 |
| 5,412,331 | 5/1995 | Jun et al. | 326/105 |

Primary Examiner—Joseph A. Popek
Attorney, Agent, or Firm—Bradley T. Sako

[57] ABSTRACT

A word line driver circuit (10) for driving four word lines (18) is disclosed. In a preferred embodiment, the word line driver circuit (10) includes a decoder circuit (12) for pulling a decode node (20) to a logic low level (Vss) in response to internal row decode signals, a pull-up circuit (14) for pulling the decode node (20) to a logic high (Vcc) to deselect the word lines (18), four transfer transistors (N0) intermediate the decode node (20) and four control nodes (22), four CMOS inverters (18), each driving one word line (18) between a boost voltage and Vss. A PMOS level shifter transistor (P0) is associated with each inverter (18), and has a channel width that is small relative to both the channel widths of the transfer transistors (N0) and to the devices making up the decoder circuit (12), allowing the level shifter transistors (P0) to be overpowered by the decoder circuit (12). The channel width of the inverter NMOS transistors (N2) are relatively large in relation to the inverter PMOS transistors (P2), allowing the NMOS transistors (N2) to be turned on by a voltage of Vcc−Vtn, where Vtn is the threshold voltage of the transfer transistors (N0).

21 Claims, 2 Drawing Sheets

REDUCED AREA WORD LINE DRIVING CIRCUIT FOR RANDOM ACCESS MEMORY

TECHNICAL FIELD

The present invention relates generally to high density random access memory (RAM) circuits, and more particularly to word line driving circuits for high density RAMs.

BACKGROUND OF THE INVENTION

Random access memories (RAM) typically include one or more arrays, with each array having a number of memory cells arranged in rows and columns. In a typical RAM layout, bit lines are disposed along the columns and word lines along the rows. Each memory cell of a row is coupled to a bit line (or bit line pair) by one or more pass transistors. The pass transistors of each row are controlled by a word line. Each word line has an associated word line driver circuit, which drives the word line between a first voltage and a second voltage, to turn the pass transistors on and off, respectively.

Because accessing the cells of a RAM (for either a read or a write operation) requires coupling the bit lines to the memory cells, the speed at which the word line driver can drive a word line between the two voltages can play an important part in the overall speed of the RAM. The goal of providing fast word line drivers, however, is complicated by competing memory design considerations.

RAM memory capacities are continually increasing. Presently, SRAMs of 1 megabit size and DRAMs of 16 megabits are becoming commonplace. Larger memory sizes can lead to longer word lines, creating a more capacitive load for the word line driver. To increase the speed at which the word line driver circuits charge their word lines, it is known to provide a boosted voltage (commonly referred to as Vpp) that is greater than the positive supply voltage. The word line driver circuits then drive their respective word lines between Vpp and a low voltage (Vss).

At the same time RAM capacities are on the rise, RAM device sizes are falling. To reduce the overall physical size of the RAM, the density of devices is pushed to current process limitations (both in the array and the periphery). Accordingly, while higher voltages are provided to increase word line driving speed, this must be accomplished with word line driver circuits having fewer and/or smaller devices.

U.S. Pat. No. 5,363,338 issued to Jong H. Oh on Nov. 8, 1994 discloses a word line driving circuit for a DRAM having four CMOS inverters, each driving a word line. A level shifter commonly drives inputs of the CMOS inverter between a Vpp and a Qss voltage, where Qss is voltage less than zero. By driving the CMOS inverter between Vpp and Qss, the word line can be driven faster than previous word line driver circuits. In the Oh patent, four word lines are commonly decoded, but only one is driven at a given time. This is accomplished by selectively applying Vpp to the pull-up transistor of one of the inverters while the pull-up transistors of the other inverters receive Vss (0 volts). A drawback to the Oh patent is the large number of devices required. Further, the timing circuits required to selectively apply Vpp or Vss to the word line drivers introduces additional complexity to the overall RAM design.

U.S. Pat. No. 5,412,331 issued to Jun et al. on May 2, 1995 discloses a word line driving circuit having an output circuit that includes a CMOS inverter with an additional PMOS transistor gate-coupled to the word line, a transfer circuit for driving the input of the output circuit between a Vpp voltage and Vss (0 volts), a precharge circuit, and a decoder circuit. In one embodiment, the word line is reset to Vss by the precharge circuit, and driven to Vpp by the operation of a word line boosting signal. In another embodiment, the word line is reset to Vss by a precharge transistor coupled to the word line, and driven to Vpp by the operation of a latched level converting circuit. The word line driver circuits of Jun et al. eliminate the need for a clocked Vpp signal, as the word line is driven to Vpp by applying a non-boosted ØXi signal to a transfer circuit. Like the word line driver circuit of the Oh patent, the Jun et al. patent requires a large number of devices. In addition, multiple Vpp devices are required per row, as Vpp pull-up devices are used in the decoding circuit 100A, transfer circuit 100C, and output circuit 100D. This adds to the size and complexity of the circuit layout. As is well understood in the art, each of these devices would have to be placed in one or more n-type wells, and be isolated from other p-channel device operating at normal logic levels (Vcc), typically by an n-channel device.

A series of self-boosting word line driver circuits are disclosed in U.S. Pat. No. 5,282,171 issued to Tokami et al. on Jan. 25, 1994. The row driving circuits of Tokami et al. require a clocked Vpp voltage and an input latch of cross coupled p-channel devices, each having a source coupled to the Vpp voltage.

While many approaches to word line driving circuits exist in the prior art, it would be desirable to arrive at a word line driver circuit that addresses the above limitations of the prior art.

SUMMARY OF THE INVENTION

It is an object of the present invention to provide a boosted word line driver circuit having a reduced layout area.

It is another object of the present invention to provide a boosted word line circuit having a reduced number of active devices.

It is yet another object of the present invention to provide a boosted word line driver circuit that includes a level shifter having a reduced number of active devices.

It is yet another object of the present invention to provide a boosted word line driver circuit wherein one of four commonly decoded word lines can be selected by a non-boosted logic signal.

According to the present invention a word line driver circuit includes a number of inverters, level shifter transistors, and transfer transistors, a decoder circuit and a pull-up circuit. The decoder circuit and the pull-up circuit drive a decode node between a logic high and logic low level. The transfer transistors each connect the decode node to a separate control node. An inverter is coupled to each control node, and drives a word line between a boost voltage and zero volts in response to the voltage at the control node. A level shifter transistor accompanies each inverter, and is connected by its source to the boost voltage, its drain to a control node, and by its gate to the word line of its respective inverter.

In operation, the word lines are deselected by the pull-up circuit pulling the decode node to the positive power supply. The transfer transistors are on, and provide the positive power supply less their threshold voltage (Vcc–Vtn) to the control nodes. The inverters are scaled so that their n-channel devices will fully turn on in response to the Vcc–Vtn voltage. When the inverter n-channel devices turn on, the word line voltage falls, turning on the level shifter transistor, which in turn, pulls the control node up to Vpp. The n-channel device of the inverter then fully discharges the word line to Vss (0 volts).

A word line is selected by the decoder circuit pulling the decode node to Vss, and a selected one of the transfer transistors turning on. The remaining transfer transistors are off. The size of the level shifter transistor channel width is small relative to both the transfer transistors and the devices making up the decoder circuit. Accordingly, as the decode node goes to Vss, the level shifter transistor is over-powered, and the voltage at the control node begins to fall. The pull-up device of the inverter turns on, pulling the word line to Vpp, and turning off the level shifter transistor.

According to an aspect of the present invention, a transfer signal having at least a portion at Vpp is used to turn on the transfer transistors.

According to another aspect of the present invention, the word lines are deselected by a pull-up circuit coupled to Vpp instead of Vcc. Other objects and advantages of the invention will become apparent in light of the following description thereof.

DETAILED DESCRIPTION OF THE EMBODIMENTS

Figure 1:
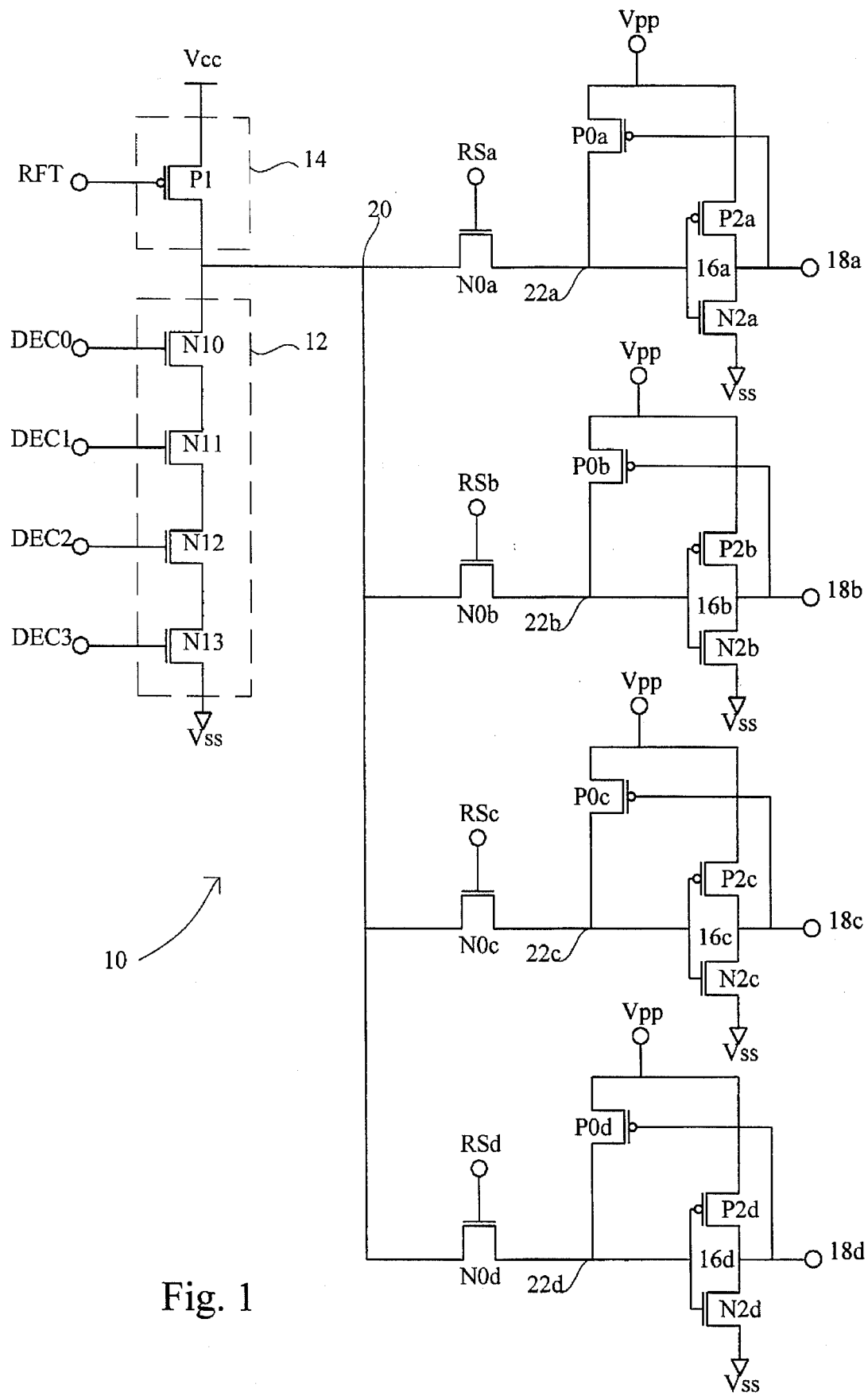
FIG. 1 is a schematic diagram illustrating a preferred embodiment of the present invention.

The word line driving circuit of a preferred embodiment of the present invention is set forth in a schematic diagram in FIG. 1, and designated by the general reference character 10. The word line driving circuit 10 is repeated a number of times in a dynamic random access memory (DRAM), with each word line driving circuit driving four word lines. The internal logic of the DRAM swings between a high power supply voltage, Vcc, and a low power supply voltage, Vss (0 volts). In addition, the positive power supply voltage is boosted, via a charge pump circuit, to provide a boosted power supply, Vpp. Voltage boost circuits are well known in the art and so will not be discussed in further detail herein.

Referring once again to FIG. 1, the word line driving circuit 10 is shown to include a decoder circuit 12, a pull-up circuit 14, four transfer transistors N0a–N0d, four CMOS inverters 16a–16d, and four level shifter transistors P0a–P0d. The inverters 16a–16d each drive an associated word line 18a–18d.

The decoder circuit 12 is situated between a decode node 20 and Vss. The decoder circuit 12 receives a number of internal decoder signals (shown and DEC0–DEC3). The decoder signals are derived using well understood decoding schemes from an externally received row address. Thus, it is understood that each word line driver circuit 10 in a given array would receive a different combination of internal decoder signals. If all of the internal decoder signals of a given word line driver circuit 10 are active (high in the preferred embodiment) the decode node 20 is pulled to Vss, and the group of four word lines 18a–18d is selected. In the preferred embodiment, the decode circuit 12 includes four n-channel transistors (N10–N13) connected in series between the decode node 20 and Vss.

The pull-up circuit 14 is situated between the decode node 20 and Vcc. The pull-up circuit 14 receives a RFT signal. If RFT is active (low in the preferred embodiment), the pull-up circuit 14 pulls the decode node to Vcc. The RFT signal is timed off of an externally applied row address strobe (RAS) signal, and according to well known timing techniques, resets the word lines 18a–18d to a deselected state once all read and/or write operations to an addressed row are complete. In the preferred embodiment, the pull-up circuit 14 is a single PMOS transistor P1 having its drain coupled to the decode node 20, its source coupled to the Vcc, and its gate receiving the RFT signal.

The transfer transistors N0a–N0d are each situated between the decode node 20 and a different control node 22a–22d. Each transfer transistor N0a–N0d recevies a row select signal, RSa–Rsd. In response to an active row select signal (high in the perferred embodiment), the transfer transistor couples the voltage at the decode node 20 to its respective control node 22a–22d. In the preferred embodiment, each tranfer transistor N0a–N0d is an NMOS transistor having its source coupled to the decode the node 20, its drain coupled to its control node 22a–22d, and its gate receiving a row select signal. It is noted that when the decode node 20 is pulled to Vcc and the transistors N0a–N0d are on (Vcc applied to their gate), each transfer transistor N0a–N0d will introduce a voltage drop between the decode node 20 and the control nodes 22a–22d that is equal to the threshold voltage (Vtn) of the transfer transistors N0a–N0d. As a result, when Vcc is at the decode node 20, the control nodes 22a–22d will be at Vcc–Vtn.

An alternate embodiment of the present invention includes a row select signal that is driven to Vpp. The alternate embodiment is effective for cases where faster control node 22 charging is desired and/or the Vtn of the transfer transistors N0a–N0d is too high. The row select signal can include an initial portion that rises to Vpp and then falls to Vcc, or can be entirely at Vpp. In the latter case, the preferred alternate embodiment includes the pull-up circuit 14 that is also coupled to Vpp.

The four inverters 16a–16d are coupled between the control nodes 22a–22d and a word line 18a–18d. Each inverter 16a–16d is composed of a PMOS pull-up transistor P2a–P2d and an NMOS pull-down transistor N2a–N2d. The NMOS devices N2a–N2d each have their sources coupled to the $V_{ss}$, their drains coupled to the their respective word lines 18a–18d, and their gates coupled to their control node 22a–22d. The PMOS devices P2a–P2d have their drains coupled to their respective word lines 18a–18d, their sources coupled to the boost voltage, Vpp, and their gates coupled to their respective control node 22a–22d. Unlike a typical inverter arrangement, wherein the relative channel width of the PMOS device is twice that of the NMOS device, in the present invention, the NMOS transistors N2a–N2d channel widths are large relative to their associated PMOS transistors P2a–P2d. The difference is sufficient to allow the Vcc–Vtn voltage level to fully turn on the NMOS devices N2a–N2d.

In the preferred embodiment, the relative width-to-length ratio between the PMOS devices and NMOS devices of the inverters 18a–18d is 7/11. That is, the n-channel widths are greater than the p-channel widths. One skilled in the art would recognize that in order to avoid a forward biased junction between Vpp and Vcc, the PMOS transistors P2a–P2d are body coupled to their sources, and do not share a p-type well with other PMOS devices operating at a Vcc level. Further, it would be recognized that the disparity in inverter transistor sizes can be reduced by the alternate embodiment described above, which employs Vpp at the transfer transistors N0a–N0d and/or the pull-up circuit 14.

Figure 2:
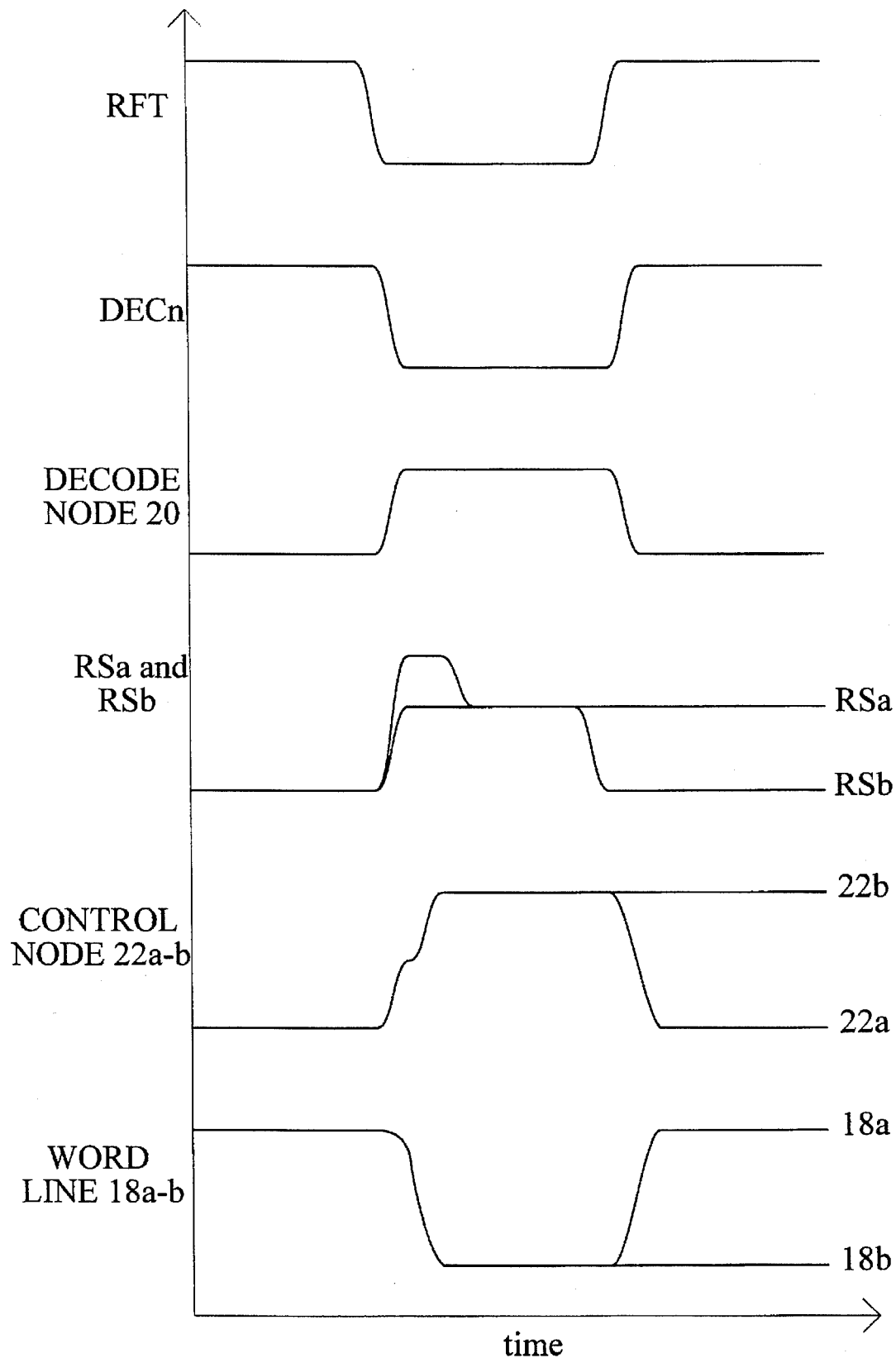
FIG. 2 is a timing diagram illustrating the operation of the preferred embodiment set forth in FIG. 1.

The level shifter transistors P0a–P0d are situated between the inverters 16a–16b and the word lines 18a–18d. As shown in FIG. 1, the level shifter transistors P0a–P0d are PMOS transistors having their drains coupled to their respective control nodes 22a–22d their sources coupled to Vpp, and their gates coupled their respective word lines 18a–18d. The size of the level shifter transistors P0a–P0d plays an important role in the present invention. The channel widths of the level shifter transistors P0a–P0d are small relative to the transfer transistors N0a–N0d and the transistors making up the decoder circuit 12 (N10–N13). When the level shifter transistors P0a–P0d are on, and the control node is pulled to Vpp, the relatively small size of the level shifter transistors P0a–P0d allows the associated transfer transistor N0a–N0d and decoder circuit 12 to overpower a level shifter transistors P0a–P0d and pull its associated control node 22a–22d to Vss, and select a word line 18a–18d. In the preferred embodiment, the relative channel widths between the level shifter transistors, transfer transistors, and the smallest decode transistor are 1.5, 5.8, and 7.9, respectively. It is understood that the PMOS devices P0a–P0d are body coupled to their sources, and, in a preferred embodiment, share a well with the PMOS transistors P2a–P2d of their respective inverters 18a–18d Having described the various components of a preferred embodiment, the operation of the present invention will now be described. Referring now to FIG. 2 in conjunction with FIG. 1, when a row access (read or write operations to the row) is complete, the word lines 18a–18d are deselected by being driven to Vss. The deselect operation begins with the RFT signal falling, turning on transistor P1 of the pull-up circuit 14. The decode signals DEC0–DEC3 go low, turning off decoder transistors N10–N13. The voltage at the decode node 20 begins rising to Vcc via the pull-up circuit 14.

During the deselect operation, the row select signals RSa–RSd are all high, and transfer transistors N0a–N0d are turned on. Accordingly, the voltage at the control nodes 22 rises with the decode node 20.

As will be recalled, the NMOS devices N2a–N2d of the CMOS inverters 16a–16d have relatively large channel widths with respect to the PMOS devices P2a–P2d. As a result, prior to the control nodes 22a–22d reaching a Vcc–Vtn level, the NMOS devices N2a–N2d begin to turn on.

As the NMOS devices N2a–N2d of the inverters 16a–16d turn on, the voltage of their respective word lines 18a–18d begins to fall at a certain rate. Once the word line voltages fall more than Vpp–Vtp (where Vtp is the threshold voltage of the level shifter transistors P0a–P0d) the level shifter transistors P0a–P0d turn on, pulling the control nodes 22a–22d to a Vpp level. This, in turn, increases the transconductance of the NMOS devices N2a–N2d and the word lines 18a–18d are pulled to Vss at a faster rate. Once all the word lines 18a–18d are at Vss, the deselect operation is complete.

In a select operation (for reading data from, or writing data to a given word line 18a–18d) one of the four word lines 18a–18d is driven to Vpp. A select operation begins with the RFT signal going high. According to an externally applied row address corresponding to the four word lines 18a–18d, each of the internal decode signals (DEC0–DEC3) goes high. The decode node 20 is thus pulled to Vss.

Unlike the deselect operation, in the select operation, only one of the row select signals (RS–RSd) is high. Assuming, for the purposes of this description, that word line 18a is the selected word line, RSa will remain high, while RSb–Sd will be low. With RSb–RSd low, the level shifter transistors P0b–P0d will remain on, along with the NMOS devices N2b–N2d of inverters 16b–16d. In this manner, word lines 18b–18d are maintained at the Vss level.

Conversely, with RSa high, the relatively small channel width of the level shifter transistors P0a–P0d allows the decode transistors N11–N13 (via the transfer transistor N0a) to overpower level shifter transistor P0a, and the voltage at control node 22a begins to fall to Vss. The PMOS device P2a turns on and NMOS device N2a turns off. The word line 18a is pulled to Vpp by operation of P2a, and level shifter transistor P0a is turned off. In this manner, the selected word line 18a is driven to Vpp, and the select operation is complete.

Referring once again to FIG. 2, the timing of the alternate embodiment described above, is represented by a dashed line portion of the RSa and RSb signals. In the alternate embodiment as the word lines 18 are deselected, RSa–d initially rise to Vpp, and then return to Vcc.

The preferred embodiment of the present invention advantageously allows one of four word lines to be selected with a supply voltage (Vcc) level signal, eliminating the need for a clocked boost voltage signal (Vpp). Further, by incorporating a "weak" level shifter transistor, the word lines can be driven between a Vss and Vpp level with a relatively low logic input signal (0 to Vcc–Vtn). The entire word line driving circuit of the preferred embodiment contains relatively few devices, and has only two PMOS devices coupled to Vpp, per word line. One skilled in the art would recognize that by placing the two Vpp devices of adjacent rows into the same Vpp well, the overall pitch of the row line driver circuit is very small relative to the prior art.

The invention has been described in connection with its preferred embodiments, and may be changed, and other embodiments derived, without departing from the spirit and scope of the invention. Accordingly, the invention is intended to be limited only by the appended claims.

What we claim is:

1. In a semiconductor memory device having a first power supply voltage, a second power supply voltage, and a boost power supply voltage greater than the first power supply voltage, a word line driving circuit, comprising:

a decoder circuit including a select circuit having a number of active devices coupled between a decode node and the second power supply, the select circuit pulling the control node to the second power supply in response to a plurality of active decoder signals in a select operation, the decoder circuit further including a deselect circuit coupled between the first power supply and the control node, the deselect circuit pulling the control node to the first power supply in response to an active reset signal in a deselect operation; and a plurality of word line driver stages, each said stage including, a transfer transistor coupled between the decode node and a control node and responsive to word line select signal, the transfer transistor coupling the first power supply voltage to its respective control node in the deselect operation, a first driver transistor of a first conductivity type having its source coupled to the boost voltage, its drain coupled to a word line, and its gate coupled to a control node, a second driver transistor of a second conductivity type having its source coupled to the second power supply voltage, its drain coupled to the word line, and its gate coupled the control node, and a level shifting transistor of the first conductivity type having its source coupled to the boost voltage, its drain coupled to the control node, and its gate coupled to the word line.

2. The word line driving circuit of claim 1 wherein:

the channel width of said level shifter transistor is small relative to the active devices of said decoder circuit, said decoder circuit overpowering said level shifting transistor and turning on the second driver transistor when said decoder circuit pulls the control node to the second power supply.

3. The word line driving circuit of claim 1 including:

a pull-up circuit for pulling the decode node to the first power supply voltage.

4. The word line driving circuit of claim 1 wherein:

the transfer transistors are of the second conductivity type.

5. The word line driving circuit of claim 4 wherein:

the transfer transistors are turned on by the first power supply being applied to their gates, the transfer transistors providing the first power supply voltage less their threshold voltage to their respective control nodes when the transfer transistors are turned on and the first power supply voltage is at the decode node, and the channel width of the second driver transistors are large with respect to the channel widths of the first driver transistors, such that the second driver transistors are turned on by a control node voltage of the first power supply voltage less the threshold voltage of the transfer transistors.

6. The word line driving circuit of claim 4 wherein:

the transfer transistors are turned on by transfer signal applied to their gates, the transfer signal having at least a first portion at the boost power supply voltage.

7. The word line driving circuit of claim 4 including:

a pull-up circuit for pulling the decode node to the boost power supply voltage.

8. The word line driving circuit of claim 4 wherein:

the first driver transistor is a PMOS transistor having a first channel width; and the second driver transistor is an NMOS transistor having a channel width that is greater than one half the first channel width.

9. The word line driving circuit of claim 8 wherein the channel width of the second driver transistor is greater than the first channel width.

10. The word line driver circuit of claim 1 wherein:

the first power supply is a positive power supply;

the boost voltage is a positive voltage greater than the positive power supply; and the first conductivity type is a p-channel type MOS transistor.

11. The word line driving circuit of claim 1 wherein:

the first driver transistors and the level shifter transistors are MOS transistors having a source, a drain, and a body, the bodies of said first driver transistors and level shifter transistors being coupled to the sources of their respective transistors.

12. The word line driving circuit of claim 11 wherein:

the first driver trasistor and the control node transistor share a common CMOS well.

13. The word line driving circuit of claim 1 wherein:

said decoder circuit includes a plurality of decoder transistors of the second conductivity type connected in series between the decode node and the second power supply, the gates of the decoder transistors each receiving a particular decoder address signal.

14. The word line driving circuit of claim 1 wherein:

during a read or write operation to a word line, the transfer transistor associated with the word line is turned on, and the transfer transistors not associated with the word line are turned off.

15. In a random access memory having a plurality of word lines, a word line driving circuit, comprising:

a driver circuit for each word line, said driver circuit including
a CMOS inverter having a first node coupled to a boost voltage, a second node coupled to a second supply voltage, a common gate forming a control node, and an output coupled to its respective word line,
a level shifter transistor of a first conductivity type having a source coupled to the boost voltage, a drain coupled to the control node, and a gate coupled to the word line;

a decoupling transistor for each driver circuit, each said decoupling transistor having a source connected to the control node of its respective driver circuit, the drains of said decoupling transistors being connected to a common decode node, a selected decoupling transistor coupling its respective control node to the common decode node in a select operation, each said decoupling transistor coupling its respective control node to the common decode node in a deselect operation; and a decoder circuit intermediate the decode node and the second supply voltage, said decoder circuit coupling the decode node to the second supply voltage via at least one active device in response to a decoder address in the select operation, said decoder circuit coupling the decode node to a first power supply voltage in the deselect operation.

16. The word line driving circuit of claim 15 wherein:

the channel widths of the decoupling transistors and the active devices of said decoder circuit are more than half to the channel width of the level shifter transistors.

17. The word line driver circuit of claim 15 including:

pull-up means for pulling the decode node to a first supply voltage;

the coupling signal for said decoupling transistors is at the first supply voltage level such that the voltage at its respective control node is the first supply voltage less the threshold voltage of the decoupling transistor; and the CMOS inverter drives its respective word line to the second supply voltage in response to a voltage at its input that is less than or equal to the first supply voltage less the threshold voltage of the decoupling transistors.

18. The word line driver circuit of claim 15 wherein:

the second supply voltage is ground;

the first supply voltage is a positive power supply;

the boost voltage is a positive voltage greater than that of the positive power supply; and the relative channel width-to-length ratios (W/L) between the p-channel device and the n-channel device of each CMOS inverter is less than two.

19. The word line driver circuit of claim 15 wherein:

the second supply voltage is ground;

the first supply voltage is a positive power supply voltage;

the boost voltage is a positive voltage greater than the positive power supply;

the level shifter transistors are p-channel devices;

said decoupling transistors are n-channel devices; and the active devices of said decoder circuit are n-channel transistors; wherein the smallest of the decoupling transistors of the decoder circuit transistors has a width-to-length ratios (W/L) that is at least three times that of the level shifter transistors.

20. The word line driving circuit of claim 15 including:

pull-up means for pulling the decode node to the boost voltage.

21. The word line driving circuit of claim 15 wherein:

at least a portion of the coupling signal is at the boost voltage.

* * * * *